US010686435B2

(12) United States Patent
Seo et al.

(10) Patent No.: US 10,686,435 B2
(45) Date of Patent: Jun. 16, 2020

(54) ASYMMETRIC PULSE WIDTH COMPARATOR CIRCUIT AND CLOCK PHASE CORRECTION CIRCUIT INCLUDING THE SAME

(71) Applicant: SK hynix Inc., Gyeonggi-do (KR)

(72) Inventors: Young-Suk Seo, Seoul (KR); Da-In Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/432,158

(22) Filed: Jun. 5, 2019

(65) Prior Publication Data

US 2019/0379369 A1 Dec. 12, 2019

(30) Foreign Application Priority Data

Jun. 7, 2018 (KR) ........................ 10-2018-0065463

(51) Int. Cl.
*G01R 29/02* (2006.01)
*H03K 5/156* (2006.01)
*H03K 5/05* (2006.01)
*H03K 5/19* (2006.01)

(52) U.S. Cl.
CPC ......... *H03K 5/1565* (2013.01); *G01R 29/023* (2013.01); *H03K 5/05* (2013.01); *H03K 5/19* (2013.01)

(58) Field of Classification Search
CPC .......... H03K 5/1565; H03K 5/05; H03K 5/19; G01R 29/023
USPC .................................................. 327/291–305
See application file for complete search history.

(56) References Cited

U.S. PATENT DOCUMENTS

2011/0156757 A1* 6/2011 Hayashi ........... G01R 31/31726 327/3
2011/0291722 A1* 12/2011 Kim ....................... G11C 7/222 327/161
2016/0182063 A1* 6/2016 Seo ....................... H03L 7/0812 327/149
2017/0111036 A1* 4/2017 Seo .......................... H03K 5/19

* cited by examiner

*Primary Examiner* — Tomi Skibinski
(74) *Attorney, Agent, or Firm* — IP & T Group LLP

(57) ABSTRACT

A clock phase correction circuit includes: a first variable delay circuit suitable for delaying a second source clock to generate a third clock; a first pulse generation circuit suitable for generating a first pulse signal that is activated from an edge of a first clock to an edge of the third clock and generating a second pulse signal that is activated from the edge of the third clock to the edge of the first clock; and a first delay value adjustment circuit suitable for detecting whether a ratio of a pulse width of the first pulse signal to a pulse width of the second pulse signal is greater or less than 1:3 to produce a detection result and adjusting a delay value of the first variable delay circuit based on the detection result.

20 Claims, 6 Drawing Sheets

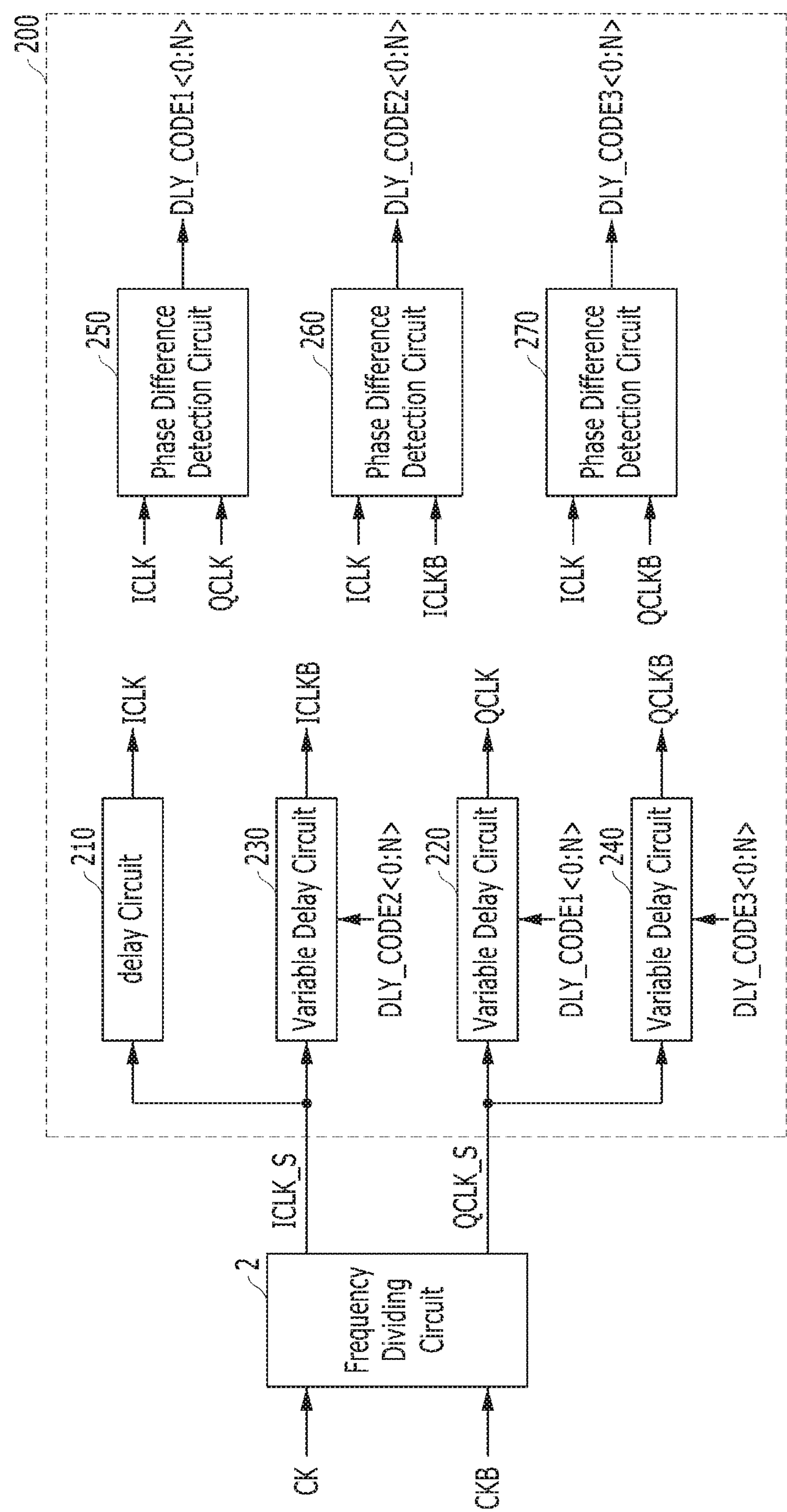
FIG. 2
200
CK
CKB
2
Frequency Dividing Circuit
ICLK_S
QCLK_S
210
delay Circuit
230
Variable Delay Circuit
DLY_CODE2<0:N>
220
Variable Delay Circuit
DLY_CODE1<0:N>
240
Variable Delay Circuit
DLY_CODE3<0:N>
ICLK
ICLKB
QCLK
QCLKB
250
Phase Difference Detection Circuit
ICLK
QCLK
DLY_CODE1<0:N>
260
Phase Difference Detection Circuit
ICLK
ICLKB
DLY_CODE2<0:N>
270
Phase Difference Detection Circuit
ICLK
QCLKB
DLY_CODE3<0:N>

270
610
Pulse Generation Circuit
ICLK
QCLKB
CK_3
CK_3B
620
630
631
632
633
634
635
636
650
Code Generator
DLY_CODE3<0:N>
COMP3
COMP_EN
VC5
VC6
VDD
VDD
P61
P62
PCGB
VC5
VC6
N61
N62
N63
CS3
DIS
CK_3
CK_3B

ASYMMETRIC PULSE WIDTH COMPARATOR CIRCUIT AND CLOCK PHASE CORRECTION CIRCUIT INCLUDING THE SAME

CROSS-REFERENCE TO RELATED APPLICATION

The present application claims priority 35 U.S.C. § 119(a) to Korean Patent Application No. 10-2018-0065463, filed on Jun. 7, 2018, which is incorporated herein by reference in its entirety.

BACKGROUND

1. Field

Various embodiments of the present invention relate to an asymmetric pulse width comparator circuit and a clock phase correction circuit including the asymmetric pulse width comparator circuit.

2. Description of the Related Art

As the data transfer rate of various integrated circuits such as a memory circuit increases, it becomes more burdensome to use a high-frequency clock for data transfer between integrated circuits. Therefore, in an integrated circuit chip, multi-phase clocks having frequencies less than the frequency of the clock for the data transfer between the integrated circuits are often used.

FIG. 1 is a diagram illustrating an example of multi-phase clocks.

Referring to FIG. 1, four clocks ICLK, QCLK, ICLKB and QCLKB have a phase difference of 90° with respect to each other. The rising edge of the clock ICLK and the rising edge of the clock QCLK have a phase difference of 90°. The rising edge of the clock QCLK and the rising edge of the clock ICLKB have a phase difference of 90°. The rising edge of the clock ICLKB and the rising edge of the clock QCLKB have a phase difference of 90°. FIG. 1 shows a case in which the multi-phase clocks ICLK, QCLK, ICLKB and QCLKB have the most ideal phase differences. However, such phase differences are frequently not maintained due to various noise in the integrated circuit.

SUMMARY

Embodiments of the present invention are directed to providing a technology for accurately correcting the phase difference of multi-phase clocks.

In accordance with an embodiment of the present invention, a clock phase correction circuit includes: a first variable delay circuit suitable for delaying a second source clock to generate a third clock; a first pulse generation circuit suitable for generating a first pulse signal that is activated from an edge of a first clock to an edge of the third clock and generating a second pulse signal that is activated from the edge of the third clock to the edge of the first clock; and a first delay value adjustment circuit suitable for detecting whether a ratio of a pulse width of the first pulse signal to a pulse width of the second pulse signal is greater or less than 1:3 to produce a detection result and adjusting a delay value of the first variable delay circuit based on the detection result.

In accordance with another embodiment of the present invention, an asymmetric pulse width comparison circuit includes: a first capacitor set which is discharged during an activation period of a first pulse signal after being charged to a logic high level and has a first capacitance value; a second capacitor set which is discharged during an activation period of a second pulse signal after being charged to a logic high level, and has a second capacitance value, which is N times the first capacitance value, where N is a real number greater than 1; and a comparator suitable for comparing a voltage level of the first capacitor set with a voltage level of the second capacitor set.

In accordance with yet another embodiment of the present invention, an asymmetric pulse width comparison circuit includes: a first capacitor set which is charged during an activation period of a first pulse signal after being discharged to a logic low level and has a first capacitance value; a second capacitor set which is charged during an activation period of a second pulse signal after being discharged to a logic low level, and has a second capacitance value, which is N times as big as the first capacitance value, where N is a real number greater than 1; and a comparator suitable for comparing a voltage level at both ends of the first capacitor set and a voltage level at both ends of the second capacitor set with each other.

BRIEF DESCRIPTION OF THE DRAWINGS

FIG. 2 is a block diagram illustrating a clock phase correction circuit in accordance with an embodiment of the present invention.

DETAILED DESCRIPTION

Figure 1:
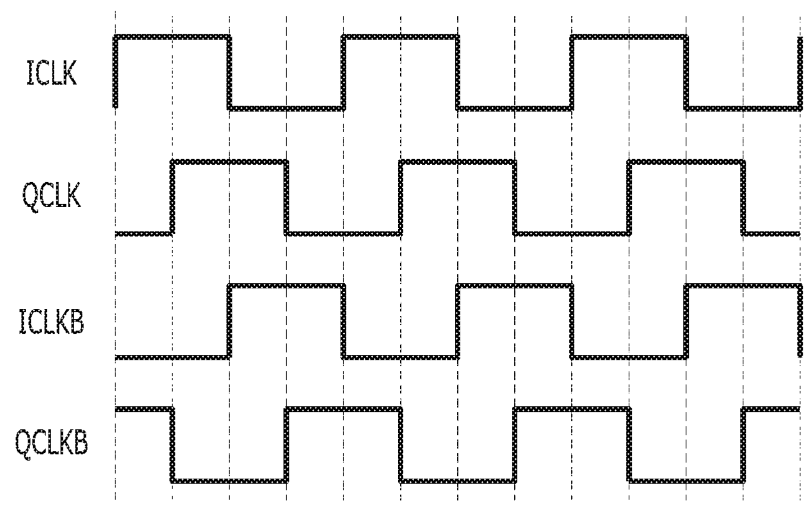
FIG. 1 is a diagram illustrating an example of multi-phase clocks.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

FIG. 2 is a block diagram illustrating a clock phase correction circuit 200 of an integrated circuit in accordance with an embodiment of the present invention. Referring to FIG. 2, the clock phase correction circuit 200 may receive source clocks ICLK_S and QCLK_S from a frequency dividing circuit 2.

The frequency dividing circuit 2 may divide a clock CK and a clock bar CKB inputted from an external source so as to generate the source clocks ICLK_S and QCLK_S. The external source may be a separate element in the integrated circuit that includes the clock phase correction circuit 200, or entirely separate from integrated circuit. The frequency dividing circuit 2 may generate a first source clock ICLK_S and generate a second source clock QCLK_S. The first source clock ICLK_S may be generated by performing a ½ frequency division on the clock CK. The second source clock QCLK_S may be generated by performing a ½ frequency division on the clock bar CKB.

Figure 3:
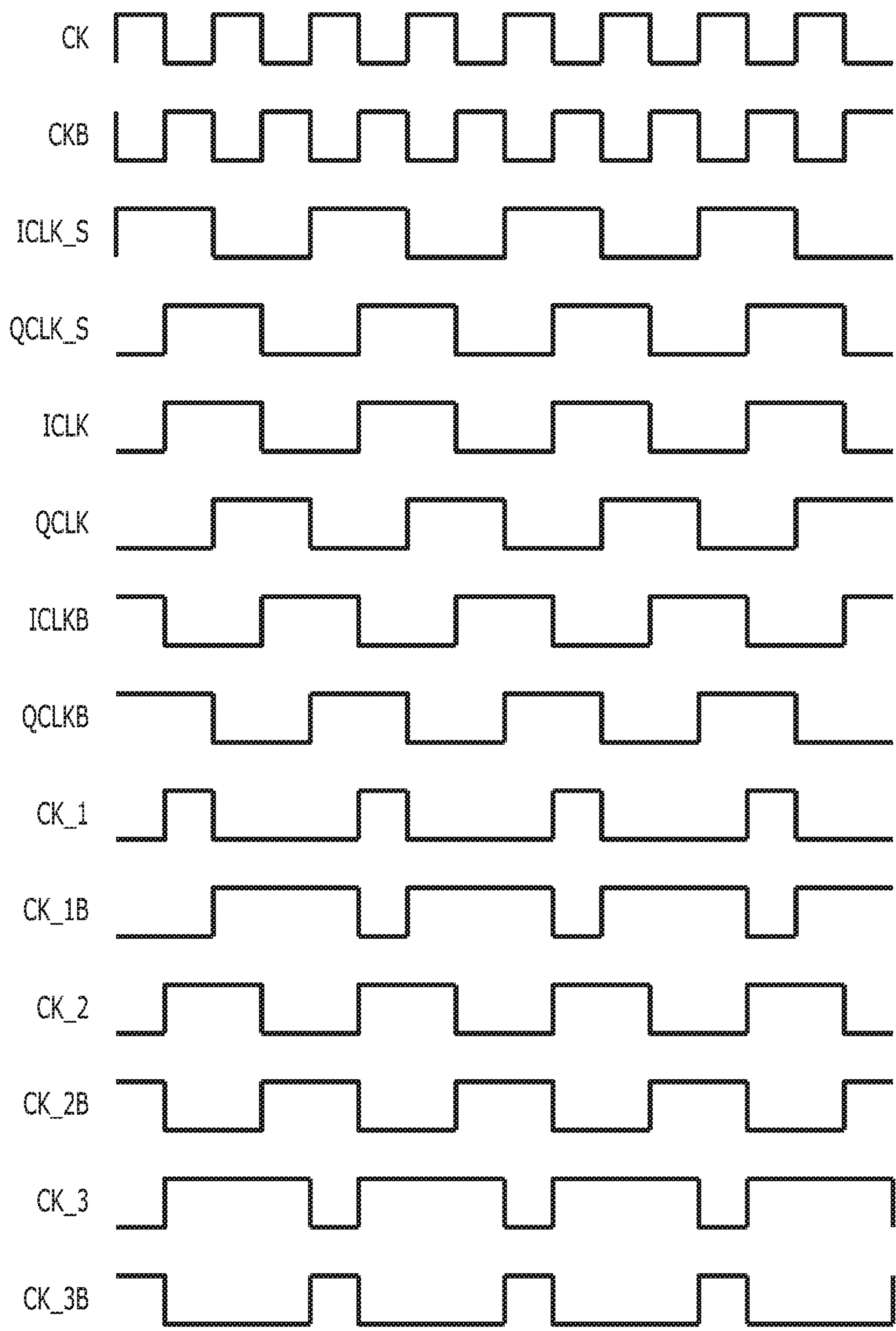
FIG. 3 is a timing diagram illustrating the phases of diverse clocks and pulse signals.

Referring to FIG. 3, the first source clock ICLK_S may transition at each rising edge of the clock CK, and the first source clock ICLK_S may have a frequency half (½) that of the clock CK. The second source clock QCLK_S may transition at each rising edge of the clock bar CKB, and the second source clock QCLK_S may have a frequency half (½) that of the clock bar CKB. The clock CK and the clock bar CKB may be inverted relative to each other. A circuit such as a delay locked loop (DLL) may be further included at the previous stage of the frequency dividing circuit 2 or between the frequency dividing circuit 2 and the clock phase correction circuit 200.

Referring again to FIG. 2, the clock phase correction circuit 200 may generate the multi-phase clocks ICLK, ICLKB, QCLK and QCLKB based on the source clocks ICLK_S and QCLK_S. The clock phase correction circuit 200 may correct the phases of the multi-phase clocks ICLK, ICLKB, QCLK and QCLKB so that the phase difference between the multi-phase clocks ICLK, ICLKB, QCLK and QCLKB may be maintained at 90°. The clock phase correction circuit 200 may include a delay circuit 210, first to third variable delay circuits 220 to 240, and first to third phase difference detection circuits 250 to 270.

The delay circuit 210 may generate a first clock ICLK by delaying the first source clock ICLK_S. In the illustrated embodiment, the first clock ICLK is used as a reference clock for adjusting the phases of the other clocks ICLKB, QCLK and QCLKB; thus, the delay circuit 210 may have a fixed delay value. Alternatively, the delay circuit 210 may be omitted and the first source clock ICLK_S may be directly used as the first clock ICLK.

The first variable delay circuit 220 may generate a third clock QCLK by delaying the second source clock QCLK_S. The delay value of the first variable delay circuit 220 may be adjusted based on a first delay code DLY_CODE1<0:N>.

The second variable delay circuit 230 may generate a second clock ICLKB by delaying the first source clock ICLK_S. The second variable delay circuit 230 may invert and delay the first source clock ICLK_S since the second clock ICLKB has a phase opposite to that of the first clock ICLK. The delay value of the second variable delay circuit 230 may be adjusted based on a second delay code DLY_CODE2<0:N>.

The third variable delay circuit 240 may generate a fourth clock QCLKB by delaying the second source clock QCLK_S. The third variable delay circuit 240 may invert and delay the second source clock QCLK_S since the fourth clock QCLKB has a phase opposite to that of the third clock QCLK. The delay value of the third variable delay circuit 240 may be adjusted based on a third delay code DLY_CODE3<0:N>.

The first phase difference detection circuit 250 may detect a phase difference between the first clock ICLK and the third clock QCLK to generate the first delay code DLY_CODE1<0:N>. When the phase difference between the first clock ICLK and the third clock QCLK is greater than 90°, the first phase difference detection circuit 250 may reduce the delay value of the first variable delay circuit 220 by reducing the value of the first delay code DLY_CODE1<0:N>. When the phase difference between the first clock ICLK and the third clock QCLK is less than 90°, the first phase difference detection circuit 250 may increase the delay value of the first variable delay circuit 220 by increasing the value of the first delay code DLY_CODE1<0:N>. In other words, the first phase difference detection circuit 250 may adjust the delay value of the first variable delay circuit 220 so that the phase difference between the first clock ICLK and the third clock QCLK becomes 90°.

The second phase difference detection circuit 260 may detect the phase difference between the first clock ICLK and the second clock ICLKB to generate the second delay code DLY_CODE2<0:N>. When the phase difference between the first clock ICLK and the second clock ICLKB is greater than 180°, the second phase difference detection circuit 260 may reduce the delay value of the second variable delay circuit 230 by reducing the value of the second delay code DLY_CODE2<0:N>. When the phase difference between the first clock ICLK and the second clock ICLKB is less than 180°, the second phase difference detection circuit 260 may increase the delay value of the second variable delay circuit 230 by increasing the value of the second delay code DLY_CODE2<0:N>. In other words, the second phase difference detection circuit 260 may adjust the delay value of the second variable delay circuit 230 so that the phase difference between the first clock ICLK and the second clock ICLKB becomes 180°.

The third phase difference detection circuit 270 may detect the phase difference between the first clock ICLK and the fourth clock QCLKB to generate the third delay code DLY_CODE3<0:N>. When the phase difference between the first clock ICLK and the fourth clock QCLKB is greater than 270°, the third phase difference detection circuit 270 may reduce the delay value of the third variable delay circuit 240 by reducing the value of the third delay code DLY_CODE3<0:N>. When the phase difference between the first clock ICLK and the fourth clock QCLKB is less than 270°, the third phase difference detection circuit 270 may increase the delay value of the third variable delay circuit 240 by increasing the value of the third delay code DLY_CODE3<0:N>. In other words, the third phase difference detection circuit 270 may adjust the delay value of the third variable delay circuit 240 so that the phase difference between the first clock ICLK and the fourth clock QCLKB becomes 270°.

The first to third variable delay circuits 220 to 240 and the first to third phase difference detection circuits 250 to 270 may operate in parallel to correct the phase difference between the multi-phase clocks ICLK, ICLKB, QCLK and QCLKB. Therefore, a phase skew occurring between the multi-phase clocks ICLK, ICLKB, QCLK and QCLKB may be corrected quickly.

FIG. 2 shows a case where the first source clock ICLK_S is inputted to the second variable delay circuit 230 and the second source clock QCLK_S is inputted to the first variable delay circuit 220 and the third variable delay circuit 240. The first to third variable delay circuits 220 to 240 may receive the same source clocks as well. Regardless of what source clock is inputted to the first to third variable delay circuits 220 to 240, the first phase difference detection circuit 250 may adjust the delay value of the first variable delay circuit 220 so that the phase difference between the first clock ICLK and the third clock QCLK becomes 90°, and the second phase difference detection circuit 260 may adjust the delay value of the second variable delay circuit 230 so that the phase difference between the first clock ICLK and the second clock ICLKB becomes 180°, and the third phase difference detection circuit 270 may adjust the delay value of the third variable delay circuit 230 so that the phase difference between the first clock ICLK and the fourth clock QCLKB is 270°.

Figure 4:
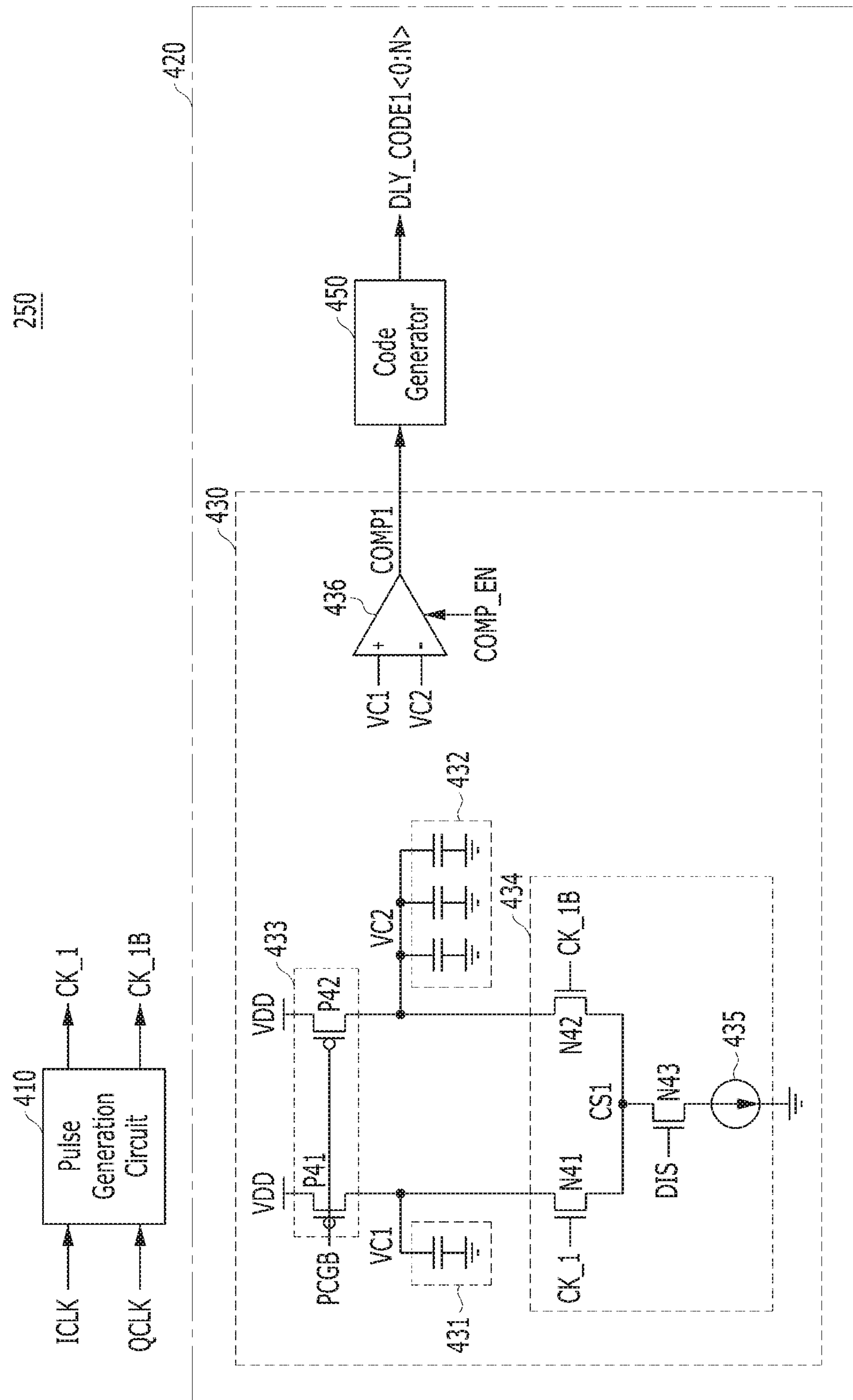
FIG. 4 is a block diagram illustrating a first phase difference detection circuit, e.g., that shown in FIG. 2, in accordance with an embodiment of the present invention.

FIG. 4 is a block diagram illustrating a first phase difference detection circuit, e.g., the first phase difference detection circuit 250 shown in FIG. 2, in accordance with an embodiment of the present invention.

Referring to FIG. 4, the first phase difference detection circuit 250 may include a first pulse generation circuit 410 and a first delay value adjustment circuit 420.

The first pulse generation circuit 410 may generate a first pulse signal CK_1 that is activated from an edge of the first clock ICLK to an edge of the third clock QCLK, the first pulse generation circuit 410 may generate a second pulse signal CK_1B that is activated from an edge of the third clock QCLK to an edge of the first clock ICLK. Any of the above-mentioned edges that define the activation periods of CK_1 and CK_1B may be a rising edge or a falling edge. By way of example, such edge is the rising edge. As shown in FIG. 3, it may be seen that the first pulse signal CK_1 is activated from a rising edge of the first clock ICLK to a rising edge of the third clock QCLK, and the second pulse signal CK_1B is activated from a rising edge of the third clock QCLK to a rising edge of the first clock ICLK.

The first delay value adjustment circuit 420 may detect whether the ratio of the pulse width of the first pulse signal CK_1 to the pulse width of the second pulse signal CK_1B is greater or less than a ratio of 1:3, and adjust the delay value of the first variable delay circuit 220 of FIG. 2 based on the detection result. When the phase difference between the first clock signal ICLK and the third clock signal QCLK is 90°, the ratio of the pulse width of the first pulse signal CK_1 to the pulse width of the second pulse signal CK_1B is 1:3. Therefore, the first delay value adjustment circuit 420 may detect whether the ratio of the pulse width of the first pulse signal CK_1 to the pulse width of the second pulse signal CK_1B is greater or less than 1:3 and adjust the delay value of the first variable delay circuit 220 based on the detection result so that the phase difference between the first clock ICLK and the third clock QCLK may become 90°. The first delay value adjustment circuit 420 may include a first pulse width comparison circuit 430 and a first code generator 450.

The first pulse width comparison circuit 430 may detect whether the ratio of the pulse width of the first pulse signal CK_1 to the pulse width of the second pulse signal CK_1B is greater or less than 1:3. The first pulse width comparison circuit 430 may include a first capacitor set 431, a second capacitor set 432, a precharger 433, a discharger 434, and a comparator 436.

The precharger 433 may precharge the first capacitor set 431 and the second capacitor set 432 to a logic high level, when a precharge signal PCGB is activated to a logic low level. The precharger 433 may include a PMOS transistor P41 and a PMOS transistor P42. The PMOS transistor P41 may precharge the first capacitor set 431 to a logic high level in response to the precharge signal PCGB. The PMOS transistor P42 may precharge the second capacitor set 432 to a logic high level in response to the precharge signal PCGB.

The discharger 434 may be activated when a discharge signal DIS is activated to a logic high level. While the discharger 434 is activated, the first capacitor set 431 may be discharged during an activation period of the first pulse signal CK_1 and the second capacitor set 432 may be activated during an activation period of the second pulse signal CK_1B. The discharger 434 may include a first current source 435, and NMOS transistors N41, N42 and N43. NMOS transistor N43 may electrically connect a first common source node CS1 to the first current source 435 in response to the discharge signal DIS. NMOS transistor N41 may discharge a current from the first capacitor set 431 to the first common source node CS1 while the first pulse signal CK_1 is activated. NMOS transistor N42 may discharge a current from the second capacitor set 432 to the first common source node CS1 while the second pulse signal CK_2 is activated.

The ratio of the capacitance of the first capacitor set 431 to that of the second capacitor set 432 may be 1:3. Each of the first capacitor set 431 and the second capacitor set 432 may include one or more capacitors that are coupled in parallel. The ratio of the capacitance of the first capacitor set 431 to that of the second capacitor set 432 may be decided based on the pulse width ratio of the pulse signals CK_1 and CK_1B to be compared. FIG. 4 shows, by way of example, that the first pulse width comparison circuit 430 performs comparison to determine whether the ratio of the pulse width of the first pulse signal CK_1 to the pulse width of the second pulse signal CK_1B is greater or less than 1:3, and whether the ratio of the capacitance of the first capacitor set 431 to that of the second capacitor set 432 is 1:3. However, when the first pulse width comparison circuit 430 decides whether the ratio of the pulse width of the first pulse signal CK_1 to the pulse width of the second pulse signal CK_1B is greater or less than 1:M (M is a natural number), the pulse width ratio of the first capacitor set 431 to that of the second capacitor set 432 may be 1:M. By varying the ratio with respect to the first capacitor set 431 and the second capacitor set 432, the first pulse width comparison circuit 430 may compare the pulse widths of pulse signals having different pulse widths, that is, asymmetric pulse widths, with each other.

The absolute values of the capacitances of the first capacitor set 431 and the second capacitor set 432 may be adjusted based on the frequency of the pulse signals CK_1 and CK_1B. For example, as the frequency of the pulse signals CK_1 and CK_1B becomes higher, the capacitances of the first capacitor set 431 and the second capacitor set 432 may be decreased while maintaining the ratio of 1:3. For another example, as the frequency of the pulse signals CK_1 and CK_1B is lower, the capacitances of the first capacitor set 431 and the second capacitor set 432 may be increased while maintaining the ratio of 1:3.

When a comparison signal COMP_EN is activated to a logic high level, the comparator 436 may compare the level of a voltage VC1 at both ends of the first capacitor set 431 with the level of a voltage VC2 at both ends of the second capacitor set 432. A comparison result COMP1 of the comparator 436 being a logic high level may represent that the ratio of the pulse width of the first pulse signal CK_1 to the pulse width of the second pulse signal CK_1B is less than 1:3. The comparison result COMP1 of the comparator 436 being a logic low level may represent that the ratio of the pulse width of the first pulse signal CK_1 to the pulse width of the second pulse signal CK_1B is greater than 1:3.

The overall operation of the first pulse width comparison circuit 430 is described below. First, in a precharge period in which a precharge signal PCG is activated to a logic low level, the first capacitor set 431 and the second capacitor set 432 may be both precharged to a logic high level by the precharger 433. The discharge signal DIS may be activated to a logic high level in a discharge period following the precharge period. In the discharge period, the first capacitor set 431 may be discharged during a period in which the first pulse signal CK_1 is in a logic high level, and the second capacitor set 432 may be discharged during a period in which the second pulse signal CK_1B is in a logic high level. In a comparison period following the discharge period, a comparison signal COMP_EN may be activated to a logic high level and the comparator 436 may be activated so that the level of the voltage VC1 at both ends of the first capacitor set 431 and the level of the voltage VC2 at both ends of the second capacitor set 432 may be compared with each other so as to output the comparison result COMP1. As a result, the comparison result COMP1 may represent whether the ratio of the pulse width of the first pulse signal CK_1 to the pulse width of the second pulse signal CK_1B is greater or less than 1:3. The precharge period, the discharge period, and the comparison period may be repeated periodically.

The first code generator 450 may adjust the value of the first delay code DLY_CODE1<0:N> in response to the comparison result COMP1 of the comparator 436. When the comparison result COMP1 is in a logic high level, the first code generator 450 may increase the delay value of the first variable delay circuit 220 by increasing the value of the first delay code DLY_CODE1<0:N>. When the comparison result COMP1 is in a logic low level, the first code generator 450 may reduce the delay value of the first variable delay circuit 220 by reducing the value of the first delay code DLY_CODE1<0:N>.

After the first capacitor set 431 and the second capacitor set 432 are precharged to a logic high level, the first capacitor set 431 may be discharged in response to the first pulse signal CK_1, and the second capacitor set 432 may be discharged in response to the second pulse signal CK_1B. The pulse widths of the first pulse signal CK_1 and the second pulse signal CK_1B may be compared with each other by comparing the level of the voltage VC1 at both ends of the first capacitor set 431 and the level of the voltage VC2 at the both ends of the second capacitor set 432 with each other. Conversely, after the first capacitor set 431 and the second capacitor set 432 are discharged to a logic low level, the first capacitor set 431 may be charged in response to the first pulse signal CK_1, and the capacitor set 432 may be charged in response to the second pulse signal CK_1B. The pulse widths of the first pulse signal CK_1 and the second pulse signal CK_1B may be compared with each other by comparing the level of the voltage VC1 at both ends of the first capacitor set 431 and the level of the voltage VC2 at the both ends of the second capacitor set 432 with each other.

Figure 5:
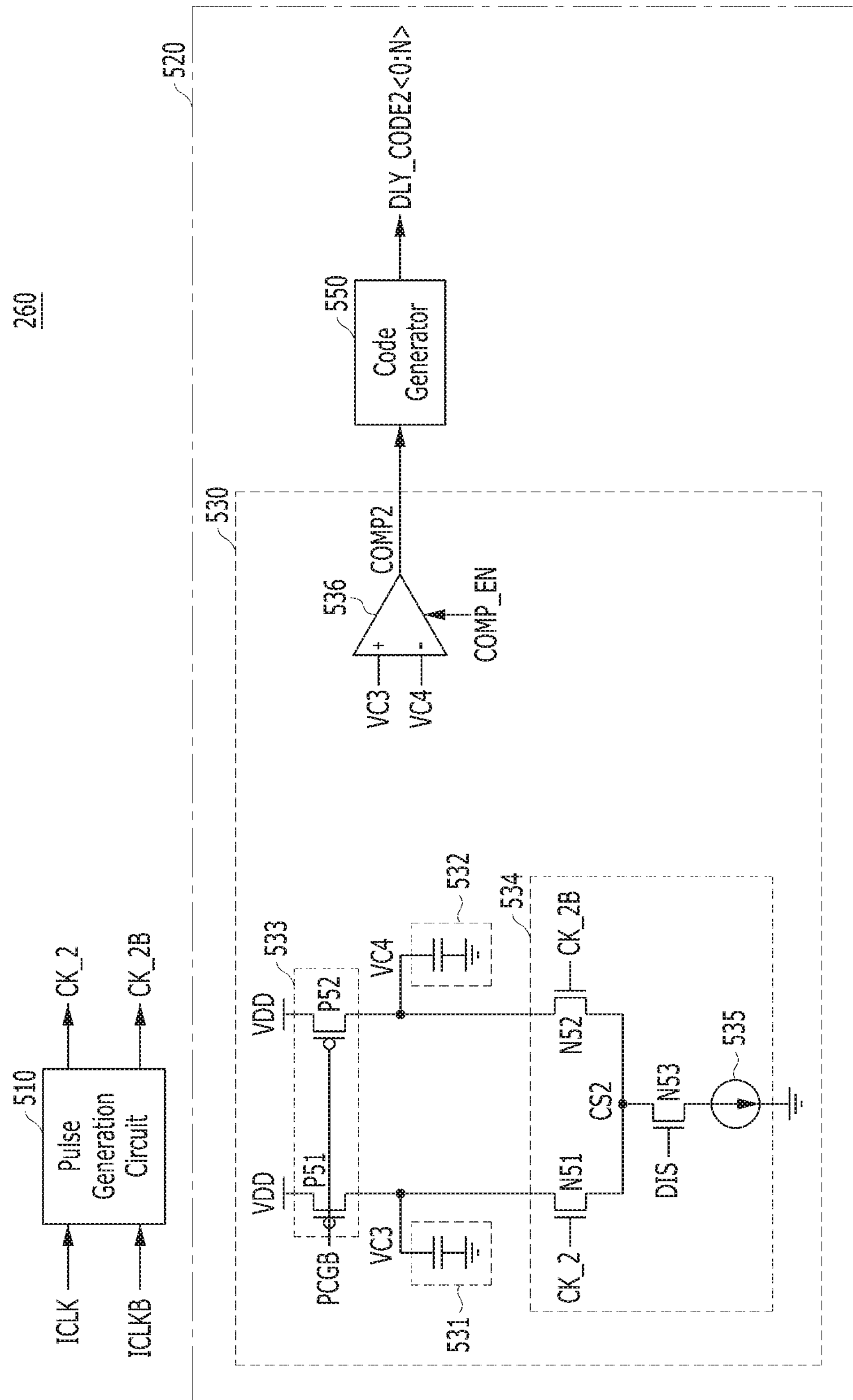
FIG. 5 is a block diagram illustrating a second phase difference detection circuit, e.g., that shown in FIG. 2, in accordance with an embodiment of the present invention.

FIG. 5 is a block diagram illustrating a second phase difference detection circuit, e.g., the second phase difference detection circuit 260 shown in FIG. 2, in accordance with an embodiment of the present invention.

Referring to FIG. 5, the second phase difference detection circuit 260 may include a second pulse generation circuit 510 and a second delay value adjustment circuit 520.

The second pulse generation circuit 510 may generate a third pulse signal CK_2 that is activated from an edge of the first clock ICLK to an edge of the second clock ICLKB. Further, the second pulse generation circuit 510 may generate a fourth pulse signal CK_2B that is activated from an edge of the second clock ICLKB to an edge of the first clock ICLK. In the illustrated embodiment, each of the above-identified edges is a rising edge. As shown in FIG. 3, it may be seen that the third pulse signal CK_2 is activated from a rising edge of the first clock ICLK to a rising edge of the second clock ICLKB, and the fourth pulse signal CK_2B is activated from a rising edge of the second clock ICLKB to a rising edge of the first clock ICLK.

The second delay value adjustment circuit 520 may detect whether the ratio of the pulse width of the third pulse signal CK_2 to the pulse width of the fourth pulse signal CK_2B is greater or less than a ratio of 1:1 and adjust the delay value of the second variable delay circuit 230 based on the detection result. When the phase difference between the first clock ICLK and the third clock ICLKB is 180°, the ratio of the pulse width of the third pulse signal CK_2 to the pulse width of the fourth pulse signal CK_2B may be 1:1. Thus, it is possible to adjust the phase difference between the first clock ICLK and the second clock ICLKB to 180° by detecting whether the ratio of the pulse width of the third pulse signal CK_2 to the pulse width of the fourth pulse signal CK_2B is greater or less than 1:1 and adjusting the delay value of the second variable delay circuit 230 based on the detection result. The second delay value adjustment circuit 520 may include a second pulse width comparison circuit 530 and a second code generator 550.

The second pulse width comparison circuit 530 may detect whether the ratio of the pulse width of the third pulse signal CK_2 to the pulse width of the fourth pulse signal CK_2B is greater or less than 1:1. The second pulse width comparison circuit 530 may include a third capacitor set 531, a fourth capacitor set 532, a precharger 533, a discharger 534, and a comparator 536. Since the second pulse width comparison circuit 530 may be formed and operate identical to the first pulse width comparison circuit 430, except that the ratio of the voltage, charge or discharge potential of the third capacitor set 531 to that of the fourth capacitor set 532 is 1:1, detailed description on the second pulse width comparison circuit 530 is omitted here.

The second code generator 550 may adjust the value of the second delay code DLY_CODE2<0:N> in response to the comparison result COMP2 of the comparator 536. When the comparison result COMP2 is in a logic high level, the second code generator 550 may increase the delay value of the second variable delay circuit 230 by increasing the value of the second delay code DLY_CODE2<0:N>. When the comparison result COMP2 is in a logic low level, the second code generator 550 may reduce the delay value of the second variable delay circuit 230 by reducing the value of the second delay code DLY_CODE2<0:N>.

After the third capacitor set 531 and the fourth capacitor set 532 are precharged to a logic high level, the third capacitor set 531 may be discharged in response to the third pulse signal CK_2, and the capacitor set 532 may be discharged in response to the fourth pulse signal CK_2B. The pulse widths of the third pulse signal CK_2 and the fourth pulse signal CK_2B may be compared with each other by comparing the level of a voltage VC3 at both ends of the third capacitor set 531 and the level of a voltage VC4 at the both ends of the fourth capacitor set 532. Conversely, after the third capacitor set 531 and the fourth capacitor set 532 are discharged to a logic low level, the third capacitor set 531 may be charged in response to the third pulse signal and the fourth capacitor set 532 may be charged in response to the fourth pulse signal CK_2B. The pulse widths of the third pulse signal CK_2 and the fourth pulse signal CK_2B may be compared with each other by comparing the level of the voltage VC3 at both ends of the third capacitor set 531 and the level of the voltage VC4 at the both ends of the fourth capacitor set 532.

Figure 6:
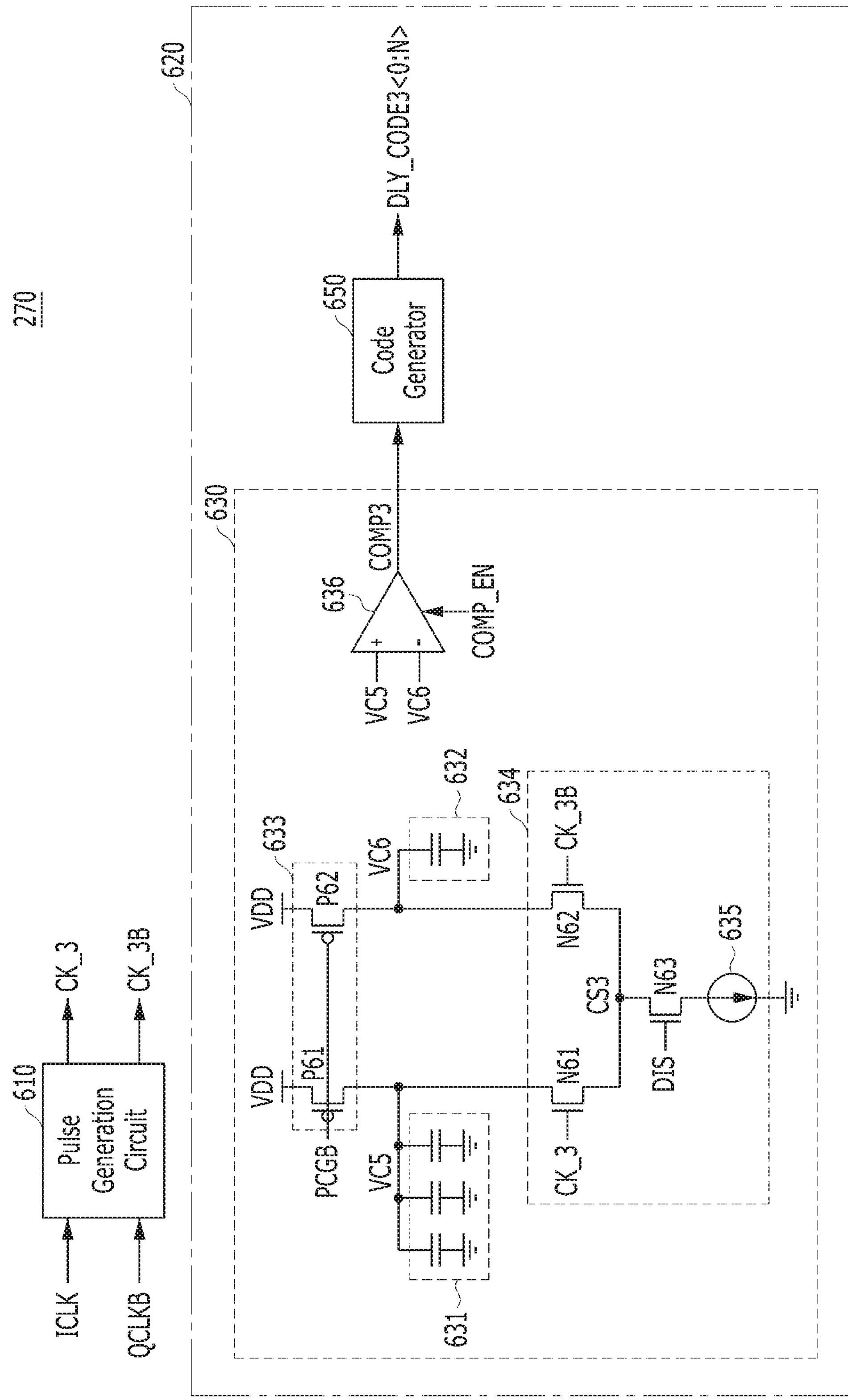
FIG. 6 is a block diagram illustrating a third phase difference detection circuit, e.g., that shown in FIG. 2, in accordance with an embodiment of the present invention.

FIG. 6 is a block diagram illustrating a third phase difference detection circuit, e.g., the third phase difference detection circuit 270 shown in FIG. 2, in accordance with an embodiment of the present invention.

Referring to FIG. 6, the third phase difference detection circuit 270 may include a third pulse generation circuit 610 and a third delay value adjustment circuit 620.

The third pulse generation circuit 510 may generate a fifth pulse signal CK_3 that is activated from an edge of the first clock ICLK to an edge of the fourth clock QCLKB. Further, the third pulse generation circuit 510 may generate a sixth pulse signal CK_3B that is activated from an edge of the fourth clock QCLKB to an edge of the first clock ICLK. Any of the above-described edges may be a rising edge or a falling edge. In the present embodiment, each such edge is a rising edge. As shown in FIG. 3, it may be seen that the fifth pulse signal CK_3 is activated from a rising edge of the first clock ICLK to a rising edge of the fourth clock QCLKB and the sixth pulse signal CK_3B is activated from a rising edge of the fourth clock QCLKB to a rising edge of the first clock ICLK.

The third delay value adjustment circuit 620 may detect whether the ratio of the pulse width of the fifth pulse signal CK_3 to the pulse width of the sixth pulse signal CK_3B is greater or less than a ratio of 3:1 and adjust the delay value of the third variable delay circuit 240 based on the detection result. When the phase difference between the first clock ICLK and the fourth clock QCLKB is 270°, the ratio of the pulse width of the fifth pulse signal CK_3 to the pulse width of the sixth pulse signal CK_3B may be 3:1. Therefore, the phase difference between the first clock ICLK and the fourth clock QCLKB may become 270° by detecting whether the ratio of the pulse width of the fifth pulse signal CK_3 to the pulse width of the sixth pulse signal CK_3B is greater or less than 3:1 and adjusting the delay value of the third variable delay circuit 240 based on the detection result. The third delay value adjustment circuit 620 may include a third pulse width comparison circuit 630 and a third code generator 650.

The third pulse width comparison circuit 630 may detect whether the ratio of the pulse width of the fifth pulse signal CK_3 to the pulse width of the sixth pulse signal CK_3B is greater or less than 3:1. The third pulse width comparison circuit 630 may include a fifth capacitor set 631, a sixth capacitor set 632, a precharger 633, a discharger 634, and a comparator 636. The third pulse width comparison circuit 630 may be formed and operate identical to the first pulse width comparison circuit 430, except that the ratio of an electrical quantity of the fifth capacitor set 631 to that of the sixth capacitor set 632 is 3:1. Therefore, detailed description on the third pulse width comparison circuit 630 is omitted here.

The third code generator 650 may adjust the value of the third delay code DLY_CODE3<0:N> in response to a comparison result COMP3 of the comparator 636. When the comparison result COMP3 is in a logic high level, the third code generator 650 may increase the delay value of the third variable delay circuit 240 by increasing the value of the third delay code DLY_CODE3<0:N>. When the comparison result COMP3 is in a logic low level, the third code generator 650 may reduce the delay value of the third variable delay circuit 240 by reducing the value of the third delay code DLY_CODE3<0:N>.

After the fifth capacitor set 631 and the sixth capacitor set 632 are precharged to a logic high level, the fifth capacitor set 631 may be discharged in response to the fifth pulse signal CK_3, and the sixth capacitor set 632 may be discharged in response to the sixth pulse signal CK_3B. The pulse widths of the fifth pulse signal CK_3 and the sixth pulse signal CK_3B may be compared with each other by comparing the level of a voltage VC5 at both ends of the fifth capacitor set 631 and the level of a voltage VC6 at the both ends of the sixth capacitor set 632 with each other. Conversely, after the fifth capacitor set 631 and the sixth capacitor set 632 are discharged to a logic low level, the fifth capacitor set 631 may be charged in response to the fifth pulse signal CK_3, and the sixth capacitor set 632 may be charged in response to the sixth pulse signal CK_3B. The pulse widths of the fifth pulse signal CK_3 and the sixth pulse signal CK_3B may be compared with each other by comparing the level of the voltage VC5 at both ends of the fifth capacitor set 631 and the level of the voltage VC6 at the both ends of the sixth capacitor set 632 with each other.

According to embodiments of the present invention, the phase difference between multi-phase clocks may be accurately corrected.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A clock phase correction circuit, comprising:

a first variable delay circuit suitable for delaying a second source clock to generate a third clock;

a first pulse generation circuit suitable for generating a first pulse signal that is activated from an edge of a first clock to an edge of the third clock and generating a second pulse signal that is activated from the edge of the third clock to the edge of the first clock; and a first delay value adjustment circuit suitable for detecting whether a ratio of a pulse width of the first pulse signal to a pulse width of the second pulse signal is greater or less than 1:3 to produce a detection result and adjusting a delay value of the first variable delay circuit based on the detection result.

2. The clock phase correction circuit of claim 1, further comprising:

a second variable delay circuit suitable for delaying a first source clock to generate a second clock;

a second pulse generation circuit suitable for generating a third pulse signal that is activated from the edge of the first clock to an edge of the second clock and generating a fourth pulse signal that is activated from an edge of the second clock to the edge of the first clock; and a second delay value adjustment circuit suitable for detecting whether a ratio of a pulse width of the third pulse signal to a pulse width of the fourth pulse signal is greater or less than 1:1 to produce a detection result and adjusting a delay value of the second variable delay circuit based on the detection result.

3. The clock phase correction circuit of claim 2, further comprising:

a third variable delay circuit suitable for delaying the second source clock to generate a fourth clock;

a third pulse generation circuit suitable for generating a fifth pulse signal that is activated from the edge of the first clock to an edge of the fourth clock and generating a sixth pulse signal that is activated from an edge of the fourth clock to the edge of the first clock; and a third delay value adjustment circuit suitable for detecting whether a ratio of a pulse width of the fifth pulse signal to a pulse width of the sixth pulse signal is greater or less than 3:1 so as to produce a detection result and adjusting a delay value of the third variable delay circuit based on the detection result.

4. The clock phase correction circuit of claim 3, further comprising:

a delay circuit suitable for delaying the first source clock to generate the first clock.

5. The clock phase correction circuit of claim 3, wherein the edge of the first clock is a rising edge of the first clock, and the edge of the second clock is a rising edge of the second clock, and the edge of the third clock is a rising edge of the third clock, and the edge of the fourth clock is a rising edge of the fourth clock.

6. The clock phase correction circuit of claim 3, wherein the edge of the first clock is a falling edge of the first clock, and the edge of the second clock is a falling edge of the second clock, and the edge of the third clock is a falling edge of the third clock, and the edge of the fourth clock is a falling edge of the fourth clock.

7. The clock phase correction circuit of claim 3, wherein the first source clock is obtained by dividing a clock by ½, and the second source clock is obtained by dividing a clock bar, which is an inverted clock of the clock.

8. The clock phase correction circuit of claim 3, wherein the first source clock and the second source clock are the same.

9. The clock phase correction circuit of claim 3, wherein the third delay value adjustment circuit includes:

a fifth capacitor set which is discharged during an activation period of the fifth pulse signal after being precharged to a logic high level;

a sixth capacitor set which is discharged during an activation period of the sixth pulse signal after being precharged to a logic high level;

a third comparator suitable for comparing a voltage level of the fifth capacitor set with a voltage level of the sixth capacitor set; and a third code generator suitable for generating a third delay code for adjusting a delay value of the third delay circuit in response to a comparison result of the third comparator, wherein a ratio of an electrical quantity of the fifth capacitor set to that of the sixth capacitor set is 3:1.

10. The clock phase correction circuit of claim 3, wherein the third delay value adjustment circuit includes:

a fifth capacitor set which is charged during an activation period of the fifth pulse signal after being discharged to a logic low level;

a sixth capacitor set which is charged during an activation period of the sixth pulse signal after being discharged to a logic high level;

a third comparator suitable for comparing a voltage level of the fifth capacitor set with a voltage level of the sixth capacitor set with each other; and a third code generator suitable for generating a third delay code for adjusting a delay value of the third delay circuit in response to a comparison result of the third comparator, wherein a ratio of an electrical quantity of the fifth capacitor set to that of the sixth capacitor set is 3:1.

11. The clock phase correction circuit of claim 2, wherein the second delay value adjustment circuit includes:

a third capacitor set which is discharged during an activation period of the third pulse signal after being precharged to a logic high level;

a fourth capacitor set which is discharged during an activation period of the fourth pulse signal after being precharged to a logic high level;

a second comparator suitable for comparing a voltage level of the third capacitor set with a voltage level of the fourth capacitor set; and a second code generator suitable for generating a second delay code for adjusting a delay value of the second delay circuit in response to a comparison result of the second comparator, wherein a ratio of an electrical quantity of the third capacitor set to that of the fourth capacitor set is 1:1.

12. The clock phase correction circuit of claim 2, wherein the second delay value adjustment circuit includes:

a third capacitor set which is charged during an activation period of the third pulse signal after being discharged to a logic low level;

a fourth capacitor set which is charged during an activation period of the fourth pulse signal after being discharged to a logic low level;

a second comparator suitable for comparing a voltage level of the third capacitor set with a voltage level of the fourth capacitor set; and a second code generator suitable for generating a second delay code for adjusting a delay value of the second delay circuit in response to a comparison result of the second comparator, wherein a ratio of an electrical quantity of the third capacitor set to that of the fourth capacitor set is 1:1.

13. The clock phase correction circuit of claim 1, wherein the first delay value adjustment circuit includes:

a first capacitor set which is discharged during an activation period of the first pulse signal after being precharged to a logic high level;

a second capacitor set which is discharged during an activation period of the second pulse signal after being precharged to a logic high level;

a first comparator suitable for comparing a voltage level of the first capacitor set with a voltage level of the second capacitor set; and a first code generator suitable for generating a first delay code for adjusting a delay value of the first delay circuit in response to a comparison result of the first comparator, wherein a ratio of an electrical quantity of the first capacitor set to that of the second capacitor set is 1:3.

14. The clock phase correction circuit of claim 1, wherein the first delay value adjustment circuit includes:

a first capacitor set which is charged during an activation period of the first pulse signal after being discharged to a logic low level;

a second capacitor set which is charged during an activation period of the second pulse signal after being discharged to a logic low level;

a first comparator suitable for comparing a voltage level of the first capacitor set with a voltage level of the second capacitor set; and a first code generator suitable for generating a first delay code for adjusting a delay value of the first delay circuit in response to a comparison result of the first comparator, wherein a ratio of an electrical quantity of the first capacitor set to that of the second capacitor set is 1:3.

15. An asymmetric pulse width comparison circuit, comprising:

a first capacitor set which is discharged during an activation period of a first pulse signal after being charged to a logic high level and has a first capacitance value;

a second capacitor set which is discharged during an activation period of a second pulse signal after being charged to a logic high level, and has a second capacitance value, which is N times the first capacitance value, where N is a real number greater than 1; and a comparator suitable for comparing a voltage level of the first capacitor set with a voltage level of the second capacitor set.

16. The asymmetric pulse width comparison circuit of claim 15, wherein in a precharge period, the first capacitor set and the second capacitor set are charged to a logic high level, and in a discharge period following the precharge period, the first capacitor set is discharged during an activation period of the first pulse signal and the second capacitor set is discharged during an activation period of the second pulse signal, and in a comparison period following the discharge period, the comparator compares a voltage level of the first capacitor set with a voltage level of the second capacitor set.

17. An asymmetric pulse width comparison circuit, comprising:

a first capacitor set which is charged during an activation period of a first pulse signal after being discharged to a logic low level and has a first capacitance value;

a second capacitor set which is charged during an activation period of a second pulse signal after being discharged to a logic low level, and has a second capacitance value, which is N times the first capacitance value, where N is a real number greater than 1; and a comparator suitable for comparing a voltage level of the first capacitor set with a voltage level of the second capacitor set.

18. The asymmetric pulse width comparison circuit of claim 17, wherein in a discharge period, the first capacitor set and the second capacitor set are charged to a logic low level, and in a charge period following the discharge period, the first capacitor set is charged during an activation period of the first pulse signal and the second capacitor set is charged during an activation period of the second pulse signal, and in a comparison period following the charge period, the comparator compares a voltage level of the first capacitor set with a voltage level of the second capacitor set.

19. The asymmetric pulse width comparison circuit of claim 17, wherein the first pulse signal and the second pulse signal are periodic waves, and a ratio of a capacitance value of the first capacitor set to a capacitance value of the second capacitor set is adjusted based on a frequency of the first pulse signal and a frequency of the second pulse signal while maintaining 1:M, where M is a natural number.

20. A clock phase correction circuit comprising:

a plurality of delay circuits suitable for receiving source clocks, delaying the source clocks based on delay codes and generating multi-phase clocks including a reference clock and other clocks, each of the other clocks having a set phase difference with the reference clock; and a plurality of phase difference detection circuits, wherein each of the phase difference detection circuits:

receives the reference clock and a corresponding one of the other clocks, detects a phase difference between the reference clock and the corresponding other clock, and generates a corresponding delay code based on the detected phase difference such that the detected phased difference is the same as the set phase difference for the corresponding other clock.

* * * * *